US008569945B2

United States Patent
Lee et al.

(10) Patent No.: US 8,569,945 B2
(45) Date of Patent: Oct. 29, 2013

(54) ORGANIC LIGHT EMITTING DEVICE HAVING CATHODE INCLUDING A MAGNESIUM-CALCIUM LAYER AND METHOD FOR FABRICATING THE SAME

(75) Inventors: Kwan-Hee Lee, Buwon-si (KR); Ja-Hyun Im, Suwon-si (KR)

(73) Assignee: Samsung Display Co., Ltd., Yongin (KR)

(*) Notice: Subject to any disclaimer, the term of this patent is extended or adjusted under 35 U.S.C. 154(b) by 2008 days.

(21) Appl. No.: 11/291,905

(22) Filed: Dec. 2, 2005

(65) Prior Publication Data

US 2006/0121313 A1    Jun. 8, 2006

(30) Foreign Application Priority Data

Dec. 3, 2004 (KR) .................. 10-2004-0101428

(51) Int. Cl.
*H01L 29/43* (2006.01)
*H01L 29/40* (2006.01)

(52) U.S. Cl.
USPC ........................................ 313/504; 313/503

(58) Field of Classification Search
USPC .................................. 313/503, 504
See application file for complete search history.

(56) References Cited

U.S. PATENT DOCUMENTS

| | | | |
|---|---|---|---|
| 4,720,432 A * | 1/1988 | VanSlyke et al. | 428/457 |
| 4,885,211 A | 12/1989 | Tang et al. | |
| 5,429,884 A | 7/1995 | Namiki et al. | |
| 5,776,622 A | 7/1998 | Hung et al. | |
| 6,452,218 B1 | 9/2002 | Cao | |
| 2002/0190263 A1 * | 12/2002 | Hata et al. | 257/103 |
| 2003/0164679 A1 | 9/2003 | Hamano et al. | |
| 2003/0234609 A1 * | 12/2003 | Aziz et al. | 313/504 |
| 2004/0070334 A1 | 4/2004 | Buckley et al. | |
| 2004/0155577 A1 * | 8/2004 | Yoshikawa et al. | 313/504 |
| 2005/0116626 A1 * | 6/2005 | Cheng et al. | 313/504 |
| 2006/0105199 A1 * | 5/2006 | Gerlach et al. | 428/690 |

FOREIGN PATENT DOCUMENTS

| | | |
|---|---|---|
| JP | 04230997 | 8/1992 |
| JP | 08-124679 | 5/1996 |
| JP | 11-345678 | 12/1999 |
| JP | 11-345687 | 12/1999 |
| JP | 2004146379 | 5/2001 |
| JP | 2002289358 | 10/2002 |
| JP | 2003282273 | 10/2003 |

(Continued)

OTHER PUBLICATIONS

Riel et al., Phosphorescent top-emitting organic light-emitting devices with improved light outcoupling, Jan. 20, 2003, Applied Physics Letters, vol. 82, p. 466-468.*

(Continued)

*Primary Examiner* — Anh Mai
*Assistant Examiner* — Nathaniel Lee
(74) *Attorney, Agent, or Firm* — H.C. Park & Associates, PLC

(57) ABSTRACT

An organic light emitting device and a method of fabricating the same are disclosed. The organic light emitting device includes an anode and a cathode that comprises a magnesium-calcium layer. An organic layer having at least an organic emission layer is interposed between the anode and the cathode. The organic light emitting device may have reduced driving voltage characteristics, increased luminous efficiency characteristics, and improved lifespan characteristics without forming a separate electron injection layer because of the excellent electron injection characteristics.

17 Claims, 7 Drawing Sheets

(56) References Cited

FOREIGN PATENT DOCUMENTS

| | | |
|---|---|---|
| JP | 2004095551 | 3/2004 |
| JP | 2004319321 | 11/2004 |
| JP | 2004-111280 | 4/2006 |
| KR | 1020040008848 | 1/2004 |
| KR | 1020040013969 | 2/2004 |
| WO | 2002/05361 | 1/2002 |

OTHER PUBLICATIONS

Riel et al., Phosphorescent top-emitting organic light-emitting devices with improved light outcoupling, Jan. 20, 2003, Applied Physics Letters, vol. 82, p. 466468.*
Chinese Office Action dated Mar. 14, 2008.

* cited by examiner

US 8,569,945 B2

ORGANIC LIGHT EMITTING DEVICE HAVING CATHODE INCLUDING A MAGNESIUM-CALCIUM LAYER AND METHOD FOR FABRICATING THE SAME

CROSS-REFERENCE TO RELATED APPLICATION

This application claims priority to and the benefit of Korean Patent Application No. 2004-101428, filed Dec. 3, 2004, the disclosure of which is incorporated herein by reference in its entirety.

BACKGROUND OF THE INVENTION

1. Field of the Invention

The present invention relates to an organic light emitting device having a cathode including a magnesium-calcium layer and a method for fabricating the same.

2. Description of the Background

In general, an organic light emitting device includes an anode, an organic emission layer disposed on the anode, and a cathode disposed on the organic emission layer. When a voltage is applied between the anode and the cathode, holes are injected into the organic emission layer from the anode and electrons are injected into the organic emission layer from the cathode. The holes and electrons that are injected into the organic emission layer are combined in the organic emission layer to create excitons, and the excitons are transitioned from an excited state to a ground state to emit light.

Here, the cathode should have a low work function in order to readily inject the electrons into the organic emission layer. A material that satisfies this condition is magnesium that has a work function of 3.46 eV. However, the magnesium cannot be used to form a stable organic light emitting device since it reacts with external oxygen or moisture.

In order to solve this problem, U.S. Pat. No. 4,885,211 uses a cathode having high ambient stability by forming the cathode with a magnesium-silver (Mg—Ag) alloy. As a result, it is possible to obtain an organic light emitting device with good lifespan characteristics. However, since Ag has a relatively high work function of about 4.28 eV, the magnesium-silver alloy cathode may have inferior electron injection characteristics compared to the magnesium cathode.

In U.S. Pat. No. 5,776,622 a lithium fluoride (LiF) layer is deposited onto an electron transport layer (Alq) and an Mg—Ag layer is deposited onto the LiF layer, thereby forming a bilayer cathode of LiF/Mg—Ag. The bilayer cathode of LiF/Mg—Ag may have improved electron injection characteristics when compared to a single layer cathode comprising Mg—Ag.

However, when a separate layer is formed to improve the electron injection characteristics of the cathode, the manufacturing cost may increase and throughput may be reduced.

SUMMARY OF THE INVENTION

The present invention provides an organic light emitting device with a cathode that has improved electron injection characteristics without requiring a separate electron injection layer.

Additional features of the invention will be set forth in the description which follows, and in part will be apparent from the description, or may be learned by practice of the invention.

The present invention discloses an organic light emitting device including an anode and a cathode including a magnesium-calcium layer. An organic layer including at least an organic emission layer is interposed between the anode and the cathode.

The present invention further discloses an organic light emitting device comprising an anode, a light transmissive cathode of a magnesium-calcium layer, and an organic layer interposed between the anode and the cathode and having at least an organic emission layer.

The present invention also discloses a method for fabricating an organic light emitting device comprising forming an anode on a substrate, forming an organic layer comprising at least an organic emission layer on the anode, and forming a cathode comprising a magnesium-calcium layer on the organic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
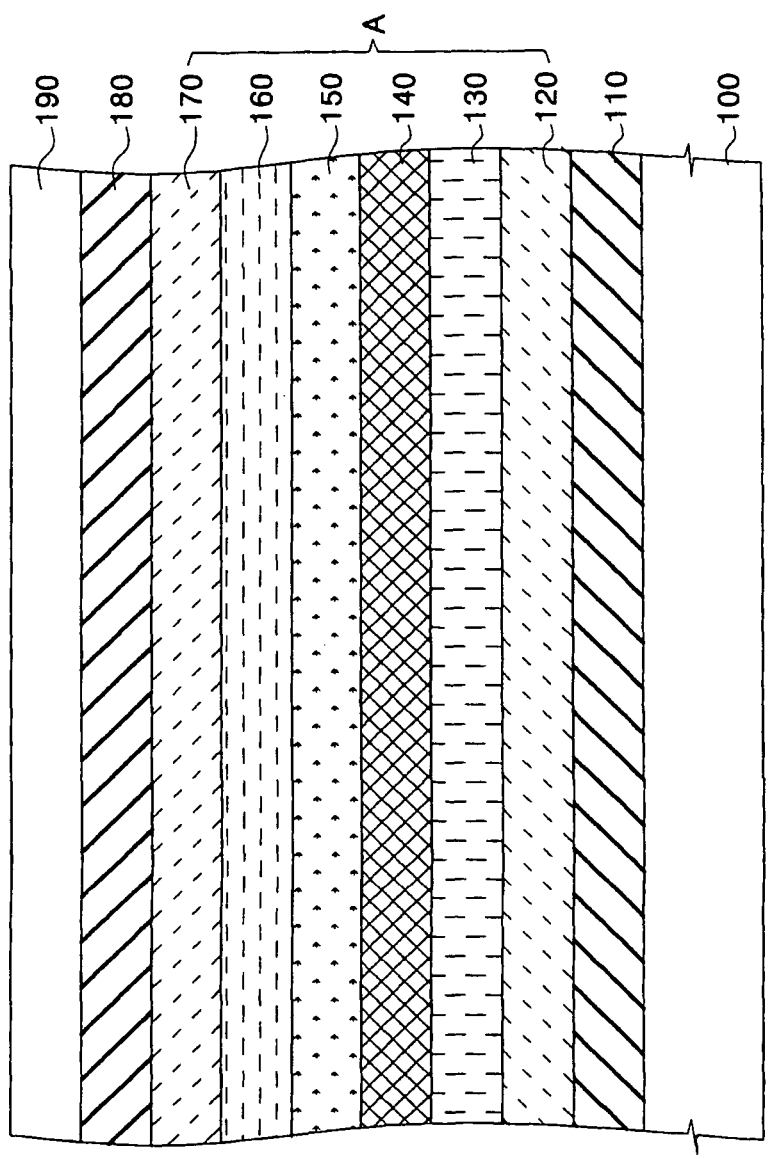
FIG. 1 is a cross-sectional view of an organic light emitting device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The present invention relates to an organic light emitting device that achieves a reduced driving voltage, increased luminous efficiency, and improved lifespan characteristics without forming a separate electron injection layer. Instead, it uses a cathode comprising an Mg—Ca layer. Improved lifespan characteristics may mean that the cathode of the Mg—Ca layer has high stability against external moisture and oxygen.

FIG. 1 is a cross-sectional view of an organic light emitting device according to an exemplary embodiment of the present invention.

Referring to FIG. 1, an anode 110 is disposed on a substrate 100. The substrate 100 may include at least one thin film transistor (not shown) that is coupled with the anode 110.

The anode 110 may be a transparent electrode or a reflective electrode. When the anode 110 is the transparent electrode, the anode 110 may be an Indium Tin Oxide (ITO) layer, an Indium Zinc Oxide (IZO) layer, a Tin Oxide (TO) layer, or a Zinc Oxide (ZnO) layer. When the anode 110 is the reflective electrode, the anode 110 may be a silver (Ag) layer, an aluminum (Al) layer, a nickel (Ni) layer, a platinum (Pt) layer, a palladium (Pd) layer or an alloy layer. The anode 110 may also be a transmissive oxide layer such as ITO, IZO, TO, and ZnO that are deposited on the alloy layer. The anode 110 may be formed by a vapor phase deposition method such as sputtering and evaporation, ion beam deposition, electron beam deposition, or laser ablation.

A hole injection layer (HIL) 120 or a hole transport layer (HTL) 130 may be placed on the anode 110. The hole injection layer 120 facilitates injection of holes into an emission layer that will be described later. The hole injection layer 120 may be formed using a low molecular material such as copper phthalocyanine (CuPc), TNATA, TCTA, TDAPB and TDATA, or a polymer material such as polyaniline (PANI), and poly(3,4)-etyhylenedioxythiophene (PEDOT). The hole transport layer 130 facilitates transportation of the holes to the emission layer, which may be formed using a low molecular weight material such as α-NPB(N,N'-Bis(naphthalene-1-yl)-N,N'-bis(phenyl)benzidine), TPD(N,N'-Bis-(3-methylphenyl)-N,N'-bis-(phenyl)-benzidine), s-TAD and MTDATA(4,4',4"-Tris(N-3-methylphenyl-N-phenyl-amino)-triphenylamine), or a polymer material such as PVK. The hole injection layer 120 and the hole transport layer 130 may be formed by vapor deposition, spin coating, inkjet printing, or laser induced thermal imaging.

An organic emission layer 140 may be disposed on the hole transport layer 130. The organic emission layer 140 may be a phosphorescent emission layer or a fluorescent emission layer. When the organic emission layer 140 is the fluorescent emission layer, the organic emission layer 140 may include distyrylarylene (DSA), distyrylarylene derivative, distrylbenzene (DSB), distrylbenzene derivative, DPVBi(4,4'-bis(2,2'-diphenyl vinyl)-1,1'-biphenyl), DPVBi derivative, Spiro-DPVBi, and Spiro-sexyphenyl, for example. The organic emission layer 140 may further include a dopant including styrylamine-based, pherylene-based, and distyrylbiphenyl (DSBP)-based materials.

On the other hand, when the organic emission layer 140 is the phosphorescent emission layer, the organic emission layer 140 may include, but is not limited to arylamine-based, carbazole-based and Spiro-based materials as a host material. The host material may include CBP (4,4-N,N dicarbazole-biphenyl), a CBP derivative, mCP (N,N-dicarbazolyl-3,5-benzene), an mCP derivative, and a Spiro-based derivative. In addition, the organic emission layer 140 may include a phosphorescent organic metal complex with one central metal including Ir, Pt, Tb and Eu as a dopant material. Further, the phosphorescent organic metal complex may include PQIr, PQIr(acac), $PQ_2Ir(acac)$, PIQIr(acac) and PtOEP.

For full-color organic light emitting devices, the organic emission layer 140 may be formed by vacuum deposition using a high-resolution mask such as a fine metal mask, inkjet printing, or laser induced thermal imaging.

A hole blocking layer (HBL) 150 may be disposed on the organic emission layer 140. However, the hole blocking layer 150 may be omitted when the organic emission layer 140 is the fluorescent emission layer. The hole blocking layer 150 suppresses diffusion of excitons created in the organic emission layer 140 when driving the organic light emitting device. The hole blocking layer 150 may comprise Balq, BCP, CF-X, TAZ or Spiro-TAZ.

An electron transport layer (ETL) 160 and an electron injection layer (EIL) 170 may be disposed on the hole blocking layer 150. The electron transport layer 160 facilitates the transport of electrons into the organic emission layer 140. The electron transport layer 160 may comprise a polymer material such as PBD, TAZ and Spiro-PBD, or a low molecular weight material such as Alq3, Balq and Salq. The electron injection layer 170 facilitates the injection of electrons into the organic emission layer 140. The electron injection layer 170 may comprise Alq3(8-quinolinolato)aluminum), LiF (lithium fluoride), Ga complex, or PBD. However, the electron injection layer 170 may be omitted. Meanwhile, the electron transport layer 160 and the electron injection layer 170 may be formed by vacuum deposition, spin coating, inkjet printing, or laser induced thermal imaging.

The hole injection layer 120, the hole transport layer 130, the organic emission layer 140, the hole blocking layer 150, the electron transport layer 160, and the electron injection layer 170 comprise an organic layer A.

A cathode 180 including a magnesium-calcium (Mg—Ca) layer is disposed on the electron injection layer 170. As a result, the organic layer A including the organic emission layer 140 is interposed between the anode 110 and the cathode 180. Since the cathode 180 comprising magnesium-calcium has excellent electron injection characteristics, the organic light emitting device including the magnesium-calcium layer has low driving voltage characteristics and high luminous efficiency characteristics even when the electron injection layer 170 is not formed, i.e., the cathode 180 and the electron transport layer 160 are in contact with each other. Therefore, the manufacturing cost may be reduced and the throughput in manufacturing the organic light emitting device may be increased.

Further, the cathode 180 includes Mg and Ca in an atomic ratio of about 1:(1/3) to about 1:3. For example, the cathode 180 may comprise Mg and Ca in an atomic ratio of about 1:1. As a result, the cathode 180 has an appropriate sheet resistance. Therefore, when the organic light emitting device is operated, a voltage (IR) drop due to the sheet resistance of the cathode 180 may be suppressed.

The cathode 180 may be a light transmissive cathode. The cathode 180 may be about 400 Å or less thick to allow for light transmittance. Further, the cathode 180 may be about 100 Å thick considering forming a layer with uniformity and sheet resistance. In general, the cathode 180 may be about 200 Å to about 300 Å thick.

A capping layer 190 may be disposed on the cathode 180 on a surface opposite a surface adjacent to the organic layer A. The capping layer 190 may be an organic layer, an inorganic layer, or a multilayer of the organic layer and the inorganic layer. The inorganic layer may be a silicon oxide ($SiO_2$) layer, a silicon nitride (SiN$_x$) layer, or a silicon oxynitride (SiO$_x$N$_y$) layer, which is an insulating layer. In addition, the inorganic layer may be an ITO layer, an IZO layer, a TO layer, or a ZnO layer which is a transparent conductive layer. Further, the inorganic layer may be a LiF layer. The organic layer may comprise NPB(N,N'-Bis(naphthalene-1-yl)-N,N'-bis(phenyl)benzidine), TNATA, TCTA, TDAPB, TDATA, Alq3, Balq, or CBP. The capping layer 190 may be formed by evaporation or sputtering. The capping layer 190 protects the organic layer A from external moisture or oxygen to prevent deterioration of the device.

When the cathode 180 is a light transmissive cathode, the capping layer 190 may be a transparent capping layer. In addition, the capping layer 190 has a higher refractive index than the cathode 180. As a result, when light emitted from the organic emission layer 140 is transferred to the exterior through the cathode 180, light transmittance may be increased by reducing the total reflection at an interface between the cathode 180 and the capping layer 190. Further, the refractive index of the capping layer 190 may be about 1.3 to about 2.3.

Examples of the present invention will now be described. However, the present invention is not limited by the following examples.

Characteristics of a red organic light emitting device including a cathode of an Mg—Ca layer Example 1

(1) Fabrication of a Red Organic Light Emitting Device

An anode having an area of 2 mm×2 mm was formed on a substrate comprising ITO, and was ultrasonically cleaned and UV-O$_3$ treated. 4,4',4"-Tris(N,N-diphenyl-amino)-triphenylamine (TDATA) was vacuum deposited on the UV-O$_3$ treated anode to a thickness of about 300 Å to form a hole injection layer. α-NPB(N,N'-Bis(naphthalene-1-yl)-N,N'-bis(phenyl)benzidine) was vacuum deposited on the hole injection layer to a thickness of about 300 Å to form a hole transport layer. CBP 100 part and PQ$_3$Ir 14 part were co-deposited on the hole transport layer to form a 400 Å thick red emission layer. Balq3 was deposited on the emission layer to a thickness of about 50 Å, and Alq3 was vacuum deposited thereon to a thickness of about 250 Å to form an electron transport layer. Mg and Ca were co-deposited on the electron transport layer to form 200 Å thick Mg—Ca layer with an atomic ratio of 1:1, thereby forming a cathode. As a result, a red organic light emitting device was formed.

(2) Measurement of Driving Voltage and Luminous Efficiency

After applying a positive voltage to the anode and grounding the cathode, the brightness of the organic light emitting device was measured using a photometer. The organic light emitting device had a driving voltage of about 5.5 V when the brightness is about 600 cd/m$^2$. In addition, the luminous efficiency was about 8.87 cd/A.

(3) Measurement of Accelerated Lifespan

Figure 2:
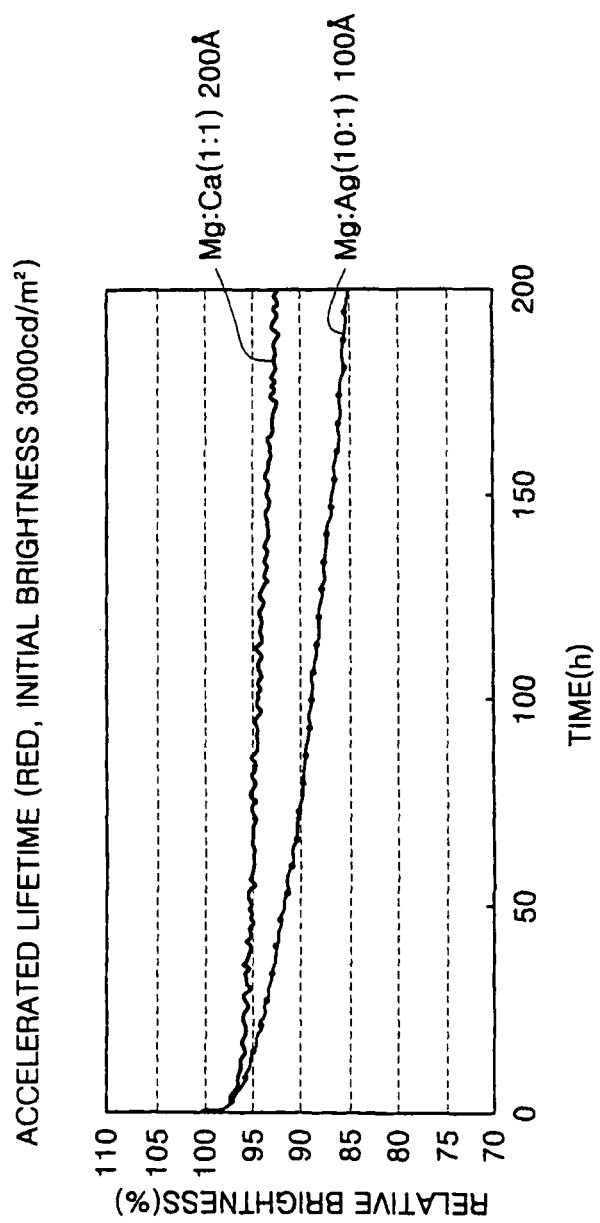
FIG. 2 is a graph of accelerated lifespan characteristics of red organic light emitting devices according to a first example and a first comparative example.

After operating the organic light emitting device until the initial brightness reaches 3000 cd/m$^2$, the decrease in brightness was recorded as a function of time as shown in FIG. 2. The initial brightness is about 5 times the brightness (600 cd/m$^2$) that is measured at the driving voltage. Generally, if the initial brightness is 100%, the lifespan is measured as time passes until the brightness is decreased to 50% of the initial brightness.

4. Measurement of Color Coordinates

Color coordinates of the organic light emitting device were measured using a color analyzer. As a result, color coordinates of (0.676, 0.322) were obtained.

Comparative Example 1

(1) Fabrication of a Red Organic Light Emitting Device

The organic light emitting device was fabricated by the same method as Example 1 except that Mg and Ag are co-deposited to form a 100 Å thick Mg—Ag layer with an atomic ratio of 10:1; thereby forming a cathode.

(2) Evaluation of Characteristics

The characteristics were measured by the same method as Example 1. As a result, the driving voltage was about 6.2 V, the brightness was 600 cd/m$^2$, luminous efficiency was 7.8 cd/A, color coordinates were (0.687, 0.312), and accelerated lifespan characteristics are shown in FIG. 2.

The characteristics of the red organic light emitting device according to Example 1 and Comparative Example 1 are shown in Table 1, and the accelerated lifespan characteristics are shown in FIG. 2.

TABLE 1

| | Conditions | | Driving voltage (V) | Brightness (cd/m$^2$) | Luminous efficiency (cd/A) | Color coordinates (CIE_x, CIE_y) |
|---|---|---|---|---|---|---|
| | EIL | Cathode | | | | |
| Example 1 | — | Mg:Ca(1:1), 200 Å | 5.5 | 600 | 8.87 | (0.676, 0.322) |
| Comparative Example 1 | — | Mg:Ag(10:1), 100 Å | 6.2 | 600 | 7.8 | (0.687, 0.312) |

Referring to Table 1 and FIG. 2, the organic light emitting device of Example 1 had a decreased driving voltage, an increased luminous efficiency, and an increased lifespan when compared to Comparative Example 1. However, the color coordinates had no significant difference. Therefore, the organic light emitting device using the Mg—Ca layer as a cathode has improved driving voltage characteristics, luminous efficiency characteristics, and lifespan characteristics when compared with the organic light emitting device using the Mg—Ag layer as a cathode.

Characteristics of a green organic light emitting device including a cathode of an Mg—Ca layer Example 2

(1) Fabrication of a Green Organic Light Emitting Device

An anode having an area of 2 mm×2 mm was formed on a substrate comprising ITO, and was ultrasonically cleaned and UV-O$_3$ treated. 4,4',4"-Tris(N,N-diphenyl-amino)-triphenylamine (TDATA) was vacuum deposited on the UV-O$_3$ treated anode to a thickness of about 200 Å to form a hole injection layer. α-NPB(N,N'-Bis(naphthalene-1-yl)-N,N'-bis(phenyl)benzidine) was vacuum deposited on the hole injection layer to a thickness of about 50 Å to form a hole transport layer. CBP 100 part and Ir(ppy)$_3$ 6 part were co-deposited on the hole transport layer to form a 400 Å thick green emission layer. Balq3 was deposited on the emission layer to a thickness of about 50 Å, and Alq3 was vacuum deposited thereon to a thickness of about 250 Å to form an electron transport layer. Mg and Ca were co-deposited on the electron transport layer to form 200 Å thick Mg—Ca layer with an atomic ratio of 1:1, thereby forming a cathode. As a result, a green organic light emitting device was formed.

(2) Measurement of Driving Voltage and Luminous Efficiency

After applying a positive voltage to the anode and grounding the cathode, the brightness of the organic light emitting device was measured using a photometer. The organic light emitting device had a driving voltage of about 4.3 V when the brightness was about 1300 cd/m$^2$. In addition, the luminous efficiency was about 66 cd/A.

(3) Measurement of Accelerated Lifespan

Figure 3:
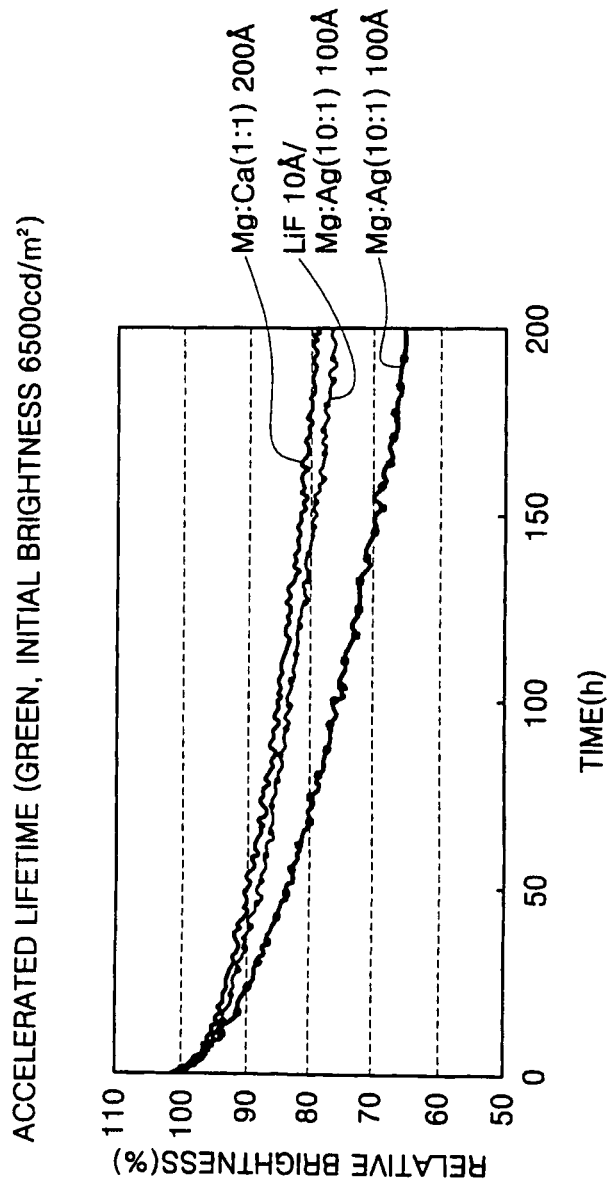
FIG. 3 is a graph of accelerated lifespan characteristics of green organic light emitting devices according to a second example and second and third comparative examples.

After operating the organic light emitting device until the initial brightness reached 6500 cd/m$^2$, the decrease in brightness was recorded as a function of time, as shown in FIG. 3. The initial brightness was about 5 times the brightness (1300 cd/m$^2$) that was measured at the driving voltage.

(4) Measurement of Color Coordinates

Color coordinates of the organic light emitting device were measured using a color analyzer. As a result, color coordinates of (0.303, 0.649) were obtained.

Comparative Example 2

(1) Fabrication of a Green Organic Light Emitting Device

The organic light emitting device was fabricated by the same method as Example 2 except that Mg and Ag were co-deposited to form a 100 Å thick Mg—Ag layer with an atomic ratio of 10:1, thereby forming a cathode.

(2) Evaluation of Characteristics

The characteristics were measured by the same method as Example 2. As a result, the driving voltage was about 5.2 V, the brightness was 1300 cd/m$^2$, luminous efficiency was 55 cd/A, color coordinates were (0.275, 0.678), and accelerated lifespan characteristics are shown in FIG. 3.

Comparative Example 3

(1) Fabrication of a Green Organic Light Emitting Device

The organic light emitting device was prepared by the same method as Example 2 except that 10 Å thick LiF was vacuum deposited on the electron transport layer to form an electron injection layer (EIL) and 100 Å thick Mg and Ag were co-deposited on the electron injection layer to form an Mg—Ag layer with an atomic ratio of 10:1, thereby forming a cathode.

(2) Evaluation of Characteristics

The characteristics were measured by the same method as Example 2. As a result, the driving voltage was about 4.2 V, brightness was about 1300 cd/m$^2$, luminous efficiency was 66 cd/A, color coordinates were (0.264, 0.683), and accelerated lifespan characteristics are shown in FIG. 3.

The characteristics of the green organic light emitting device of Example 2, Comparative Example 2, and Comparative Example 3 are shown in Table 2, and the accelerated lifespan characteristics are shown in FIG. 3.

TABLE 2

| | Conditions | | Driving voltage (V) | Brightness (cd/m$^2$) | Luminous efficiency (cd/A) | Color coordinates (CIE_x, CIE_y) |
|---|---|---|---|---|---|---|
| | EIL | Cathode | | | | |
| Example 2 | — | Mg:Ca(1:1), 200 Å | 4.3 | 1300 | 66 | (0.303, 0.649) |
| Comparative Example 2 | — | Mg:Ag(10:1), 100 Å | 5.2 | 1300 | 55 | (0.275, 0.678) |
| Comparative Example 3 | LiF, 10 Å | Mg:Ag(10:1), 100 Å | 4.2 | 1300 | 66 | (0.264, 0.683) |

Referring to Table 2 and FIG. 3, the organic light emitting device of Example 2 had a decreased driving voltage, an increased luminous efficiency, and an increased lifespan when compared to Comparative Example 2. However, the color coordinates characteristics were decreased slightly. Therefore, the green organic light emitting device using the Mg—Ca layer as a cathode has improved driving voltage characteristics, luminous efficiency characteristics, and lifespan characteristics when compared with the green organic light emitting device that uses the Mg—Ag layer as a cathode.

On the other hand, the organic light emitting device of Example 2 had no significant difference in driving voltage, luminous efficiency, and lifespan when compared to Comparative Example 3. Therefore, the organic light emitting device that uses the Mg—Ca layer as a cathode has characteristics that are substantially equal to the organic light emitting device using the Mg—Ag layer as a cathode and using LiF as an electron injection layer. Thus, when the Mg—Ca layer is used as a cathode, the electron injection layer may be omitted.

Characteristics of a blue organic light emitting device including a cathode of an Mg—Ca layer Example 3

(1) Fabrication of a Blue Organic Light Emitting Device

An anode having an area of 2 mm×2 mm was formed on a substrate comprising ITO, and was ultrasonically cleaned and UV-O$_3$ treated. 4,4',4"-Tris(N,N-diphenyl-amino)-triphenylamine (TDATA) was vacuum deposited on the UV-O$_3$ treated anode to a thickness of about 200 Å to form a hole injection layer. α-NPB(N,N'-Bis(naphthalene-1-yl)-N,N'-bis(phenyl)benzidine) was vacuum deposited on the hole injection layer to a thickness of about 50 Å to form a hole transport layer. DPVBi was vacuum deposited on the hole transport layer to form a 150 Å thick blue emission layer. Alq3 was vacuum deposited on the emission layer to a thickness of about 250 Å, to form an electron transport layer. Mg and Ca were co-deposited on the electron transport layer to form a 160 Å thick Mg—Ca layer with an atomic ratio of 1:1, thereby forming a cathode. As a result, a blue organic light emitting device was formed.

(2) Measurement of Driving Voltage and Luminous Efficiency

After applying a positive voltage to the anode and grounding the cathode, the brightness of the organic light emitting device was measured using a photometer. The organic light emitting device had a driving voltage of about 5.0 V when the brightness was about 452 cd/m$^2$. In addition, the luminous efficiency was about 5.07 cd/A.

(3) Measurement of Accelerated Lifespan

Figure 4A:
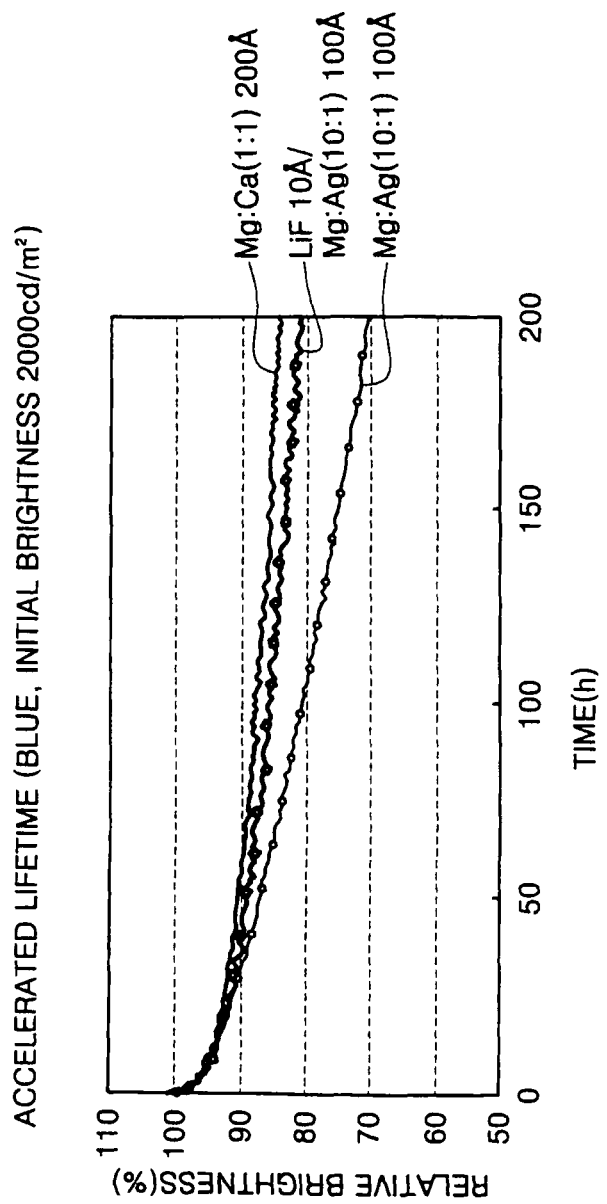
FIG. 4A is a graph of accelerated lifespan characteristics of blue organic light emitting devices according to a fifth example and fourth and fifth comparative examples.
Figure 4B:
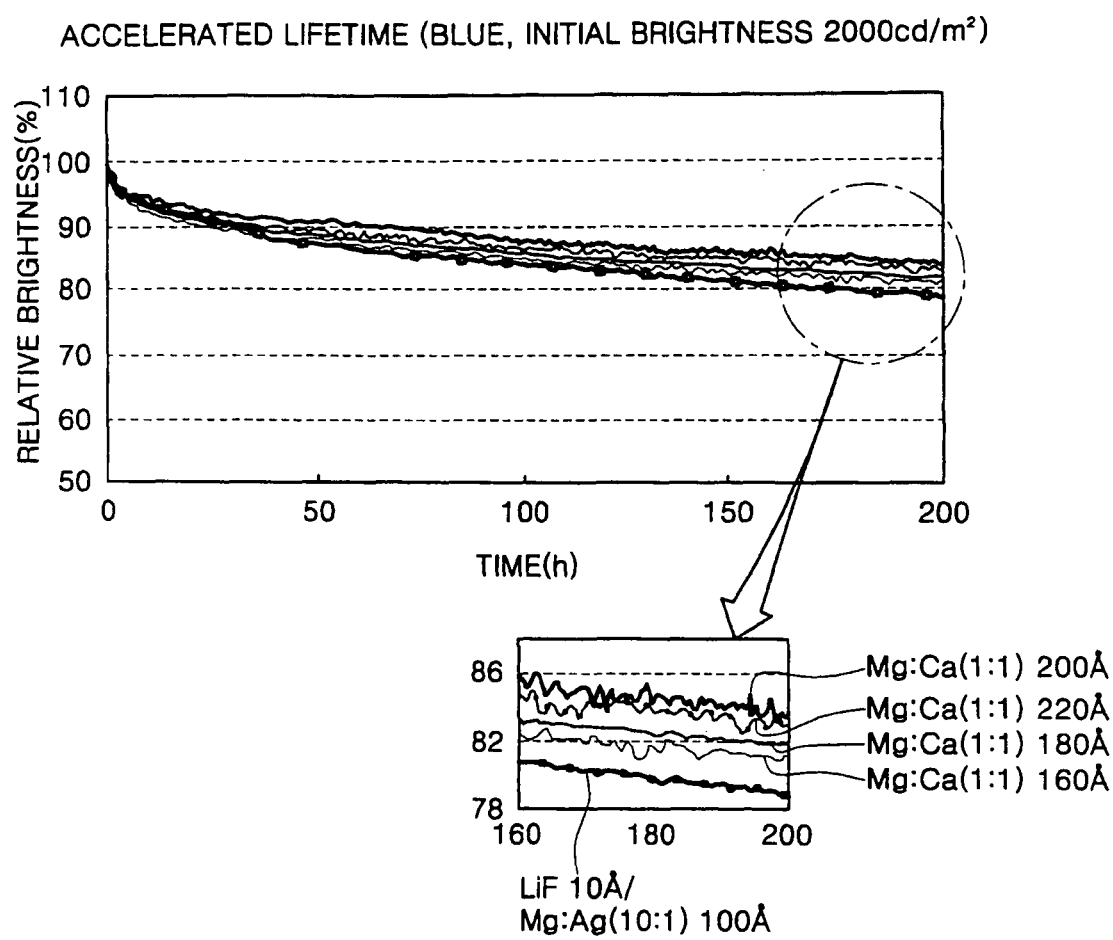
FIG. 4B is a graph of accelerated lifespan characteristics of blue organic light emitting devices according to third to sixth examples and a fifth comparative example.

After operating the organic light emitting device until the initial brightness reached 2000 cd/m$^2$, the decrease in brightness was recorded as a function of time, as shown in FIG. 4B. The initial brightness was about 5 times the brightness (452 cd/m$^2$) that was measured at the driving voltage.

(4) Measurement of Color Coordinates

Color coordinates of the organic light emitting device were measured using a color analyzer. As a result, color coordinates of (0.139, 0.135) were obtained.

Example 4

(1) Fabrication of a Blue Organic Light Emitting Device

The organic light emitting device was fabricated by the same method as Example 3 except that Mg and Ca were co-deposited to form 180 Å thick Mg—Ca layer with an atomic ratio of 1:1, thereby forming a cathode.

(2) Evaluation of Characteristics

The characteristics were measured by the same method as Example 3. As a result, driving voltage was about 4.9 V, brightness was about 440 cd/m$^2$, luminous efficiency was about 4.81 cd/A, color coordinates were (0.138, 0.132), and accelerated lifespan characteristics are shown in FIG. 4B.

Example 5

(1) Fabrication of a Blue Organic Light Emitting Device

The organic light emitting device was fabricated by the same method as Example 3 except that Mg and Ca were co-deposited to form a 200 Å thick Mg—Ca layer with an atomic ratio of 1:1, thereby forming a cathode.

(2) Evaluation of Characteristics

The characteristics were measured by the same method as Example 3. As a result, driving voltage was about 4.9 V, brightness was about 460 cd/m$^2$, luminous efficiency was about 5.19 cd/A, color coordinates were (0.137, 0.137), and accelerated lifespan characteristics are shown in FIG. 4A and FIG. 4B.

Example 6

(1) Fabrication of a Blue Organic Light Emitting Device

The organic light emitting device was fabricated by the same method as Example 3 except that Mg and Ca were co-deposited to form a 220 Å thick Mg—Ca layer with an atomic ratio of 1:1, thereby forming a cathode.

(2) Evaluation of Characteristics

The characteristics were measured by the same method as Example 3. As a result, driving voltage was about 4.9 V, brightness was about 464 cd/m$^2$, luminous efficiency was about 5.26 cd/A, color coordinates were (0.137, 0.138), and accelerated lifespan characteristics are shown in FIG. 4B.

Comparative Example 4

(1) Fabrication of a Blue Organic Light Emitting Device

The organic light emitting device was fabricated by the same method as Example 3 except that Mg and Ag were co-deposited to form a 100 Å thick Mg—Ag layer with an atomic ratio of 10:1, thereby forming a cathode.

(2) Evaluation of Characteristics

The characteristics were measured by the same method as Example 3. As a result, driving voltage was about 5.2V, brightness was about 300 cd/m$^2$, luminous efficiency was about 1.7 cd/A, color coordinates were (0.140, 0.100), and accelerated lifespan characteristics are shown in FIG. 4A.

Comparative Example 5

(1) Fabrication of a Blue Organic Light Emitting Device

The organic light emitting device was fabricated by the same method as Example 3 except that LiF was vacuum deposited on the electron transport layer to a thickness of 10 Å to from an electron injection layer, and Mg and Ag were co-deposited on the electron injection layer to form a 100 Å thick Mg—Ag layer having an atomic ratio of 10:1, thereby forming a cathode.

(2) Evaluation of Characteristics

The characteristics were measured by the same method as Example 3. As a result, driving voltage was about 4.4 V, brightness was about 362 cd/m$^2$, luminous efficiency was about 5.02 cd/A, and color coordinates were (0.134, 0.114), and accelerated lifespan characteristics are shown in FIG. 4A and FIG. 4B.

The characteristics of the blue organic light emitting device of Example 3, Example 4, Example 5, Example 6, Comparative Example 4, and Comparative Example 5 are shown in Table 3, and the accelerated lifespan characteristics are shown in FIG. 4A and FIG. 4B.

TABLE 3

| | Conditions | | Driving voltage (V) | Brightness (cd/m$^2$) | Luminous efficiency (cd/A) | Color coordinates (CIE_x, CIE_y) |
|---|---|---|---|---|---|---|
| | EIL | Cathode | | | | |
| Example 3 | — | Mg:Ca(1:1), 160 Å | 5.0 | 452 | 5.07 | (0.139, 0.135) |
| Example 4 | | Mg:Ca(1:1), 180 Å | 4.9 | 440 | 4.81 | (0.138, 0.132) |
| Example 5 | | Mg:Ca(1:1), 200 Å | 4.9 | 460 | 5.19 | (0.137, 0.137) |
| Example 6 | | Mg:Ca(1:1), 220 Å | 4.9 | 464 | 5.26 | (0.137, 0.138) |

TABLE 3-continued

|  | Conditions | | Driving voltage (V) | Brightness (cd/m$^2$) | Luminous efficiency (cd/A) | Color coordinates (CIE_x, CIE_y) |
|---|---|---|---|---|---|---|
|  | EIL | Cathode |  |  |  |  |
| Comparative Example 4 | — | Mg:Ag(10:1), 100 Å | 5.2 | 300 | 1.70 | (0.140, 0.100) |
| Comparative Example 5 | LiF, 10 Å | Mg:Ag(10:1), 100 Å | 4.4 | 362 | 5.02 | (0.134, 0.114) |

Referring to Table 3 and FIG. 4A and FIG. 4B, the organic light emitting devices of Example 3, Example 4, Example 5, and Example 6 had a decreased driving voltage, an increased luminous efficiency, and an increased lifespan when compared to Comparative Example 4, however, the color coordinates characteristics were decreased slightly. Therefore, the blue organic light emitting device using the Mg—Ca layer as a cathode has improved driving voltage characteristics, luminous efficiency characteristics, and lifespan characteristics when compared to the blue organic light emitting device using the Mg—Ag layer as a cathode. In particular, there was no significant difference in driving voltage, luminous efficiency, lifespan and color coordinates characteristics depending on the thickness of the Mg—Ca layers. Therefore, when the Mg—Ca layer is used as a cathode, characteristic uniformity may be obtained even when the case of the large-sized organic light emitting device since there is no characteristic changes depending on thickness deviation.

On the other hand, the organic light emitting devices of Example 3, Example 4, Example 5, and Example 6 had no significant difference in driving voltage, luminous efficiency and lifespan characteristics when compared to Comparative Example 5. Therefore, the organic light emitting device using the Mg—Ca layer as a cathode has characteristics that are substantially equal to the organic light emitting device using the Mg—Ag layer as a cathode and using LiF as an electron injection layer. Thus, when the Mg Ca layer is used as a cathode, the electron injection layer may be omitted.

Sheet resistance of an Mg—Ca layer

Example 7

When Mg and Ca had an atomic ratio of 1:(1/3), Mg and Ca were co-deposited on a substrate to form a 200 Å thick Mg—Ca layer with an atomic ratio of about 3:1. The formed Mg—Ca layer had a sheet resistance of about 60 Ω/m$^2$.

Example 8

When Mg and Ca had an atomic ratio of 1:1, an Mg—Ca layer was formed by the same method as Example 7 except that Mg and Ca had an atomic ratio of about 1:1. The formed Mg—Ca layer had a sheet resistance of about 16 Ω/m$^2$.

Example 9

When Mg and Ca has an atomic ratio of 1:3, an Mg—Ca layer was formed by the same method as Example 7 except that Mg and Ca had an atomic ratio of about 1:3. The formed Mg—Ca layer had a sheet resistance of about 48 Ω/m$^2$.

Comparative Example 6

Sheet resistance of an Mg—Ag layer

Mg and Ag were co-deposited on a substrate to form a 100 Å thick Mg—Ag layer with an atomic ratio of about 10:1. The formed Mg—Ag layer had a sheet resistance of about 23 Ω/m$^2$.

Sheet resistances of the Mg—Ca layers of Example 7, Example 8, and Example 9 and the Mg—Ag layer of Comparative Example 6 are shown in Table 4.

TABLE 4

| | Conditions | | |
|---|---|---|---|
| | Cathode composition (Atomic ratio) | Thickness (Å) | Sheet resistance (Ω/m$^2$) |
| Example 7 | Mg:Ca (3:1) | 200 | 60 |
| Example 8 | Mg:Ca (1:1) | 200 | 16 |
| Example 9 | Mg:Ca (1:3) | 200 | 48 |
| Comparative Example 6 | Mg:Ag (10:1) | 100 | 23 |

Referring to Table 4, when Mg and Ca have an atomic ratio of about 1:(1/3) to about 1:3, the Mg—Ca layer has a sheet resistance of about 60 Ω/m$^2$ or less. Generally, the cathode of the organic light emitting device may have a sheet resistance of about 60 Ω/m$^2$ or less. Therefore, the cathode includes Mg and Ca in an atomic ratio of about 1:(1/3) to about 1:3.

Further, when Mg and Ca have an atomic ratio of 1:1, the Mg—Ca layer has the lowest sheet resistance. In this case, the sheet resistance (16 Ω/m$^2$) of the Mg—Ca layer is decreased by about 70% when compared to the sheet resistance (23 Ω/m$^2$) of the Mg—Ag layer.

Transmissivity and reflectivity of an Mg—Ca layer

Example 10

Figure 5:
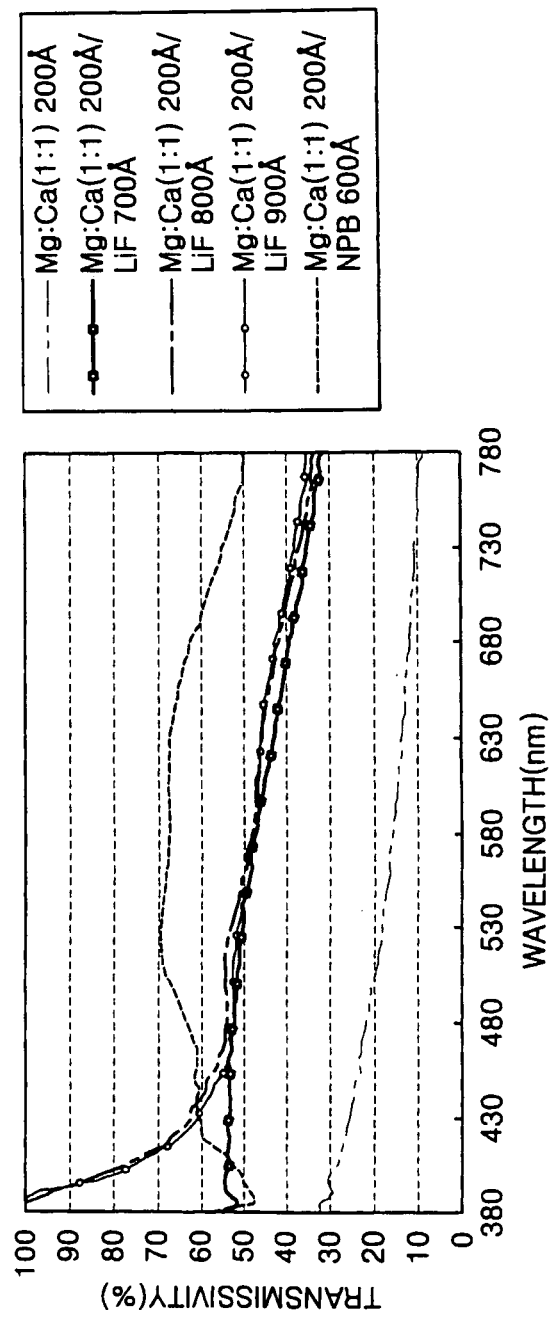
FIG. 5 is a graph of transmissivity versus wavelength of a magnesium-calcium layer and a bilayer of a magnesium-calcium layer/a capping layer according to Example 10, Example 11, Example 12, Example 13 and Example 14.
Figure 6:
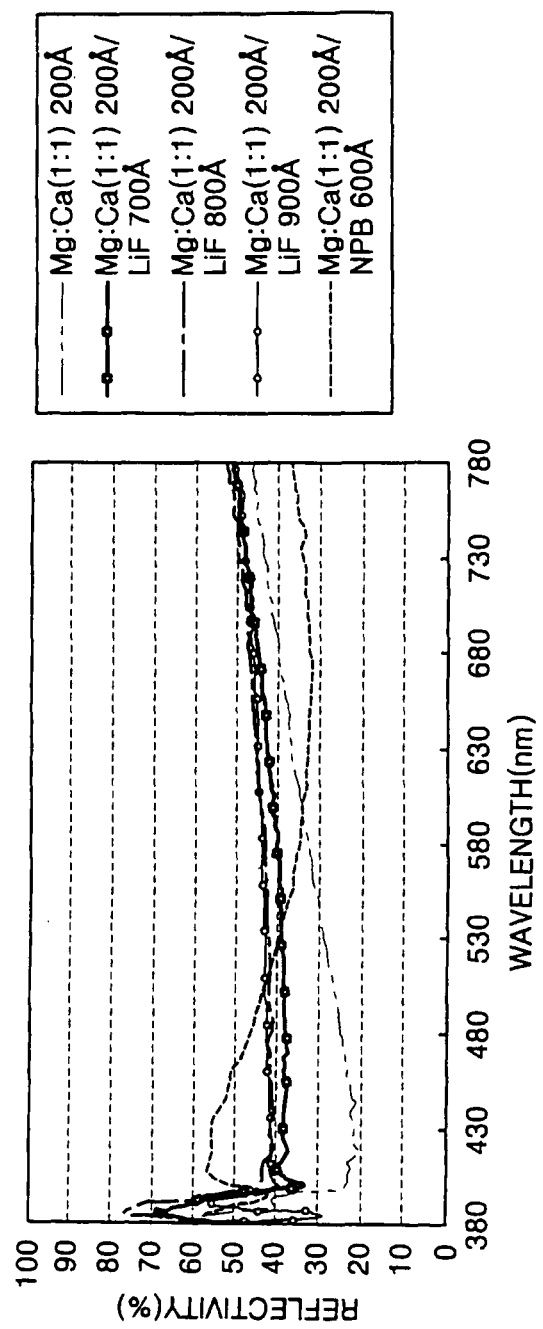
FIG. 6 is a graph of reflectivity versus wavelength of a magnesium-calcium layer and a bilayer of a magnesium-calcium layer/a capping layer according to Example 10, Example 11, Example 12, Example 13, and Example 14.

Mg and Ca were co-deposited on a substrate to form a 200 Å thick Mg—Ca layer with an atomic ratio of 1:1. Then transmissivity and reflectivity of the formed Mg—Ca layer were measured while varying a light wavelength. Results of measurement are shown in FIG. 5 and FIG. 6. At a light wavelength of 550 nm, the transmissivity was 16.82%, and the reflectivity was 31.17%.

Example 11

Mg and Ca were co-deposited on a substrate to form a 200 Å thick Mg—Ca layer having an atomic ratio of 1:1, LiF was vacuum deposited on the Mg—Ca layer to a thickness of 700 Å to form a capping layer, and then transmissivity and reflectivity of the Mg—Ca layer and the capping layer were measured while varying a light wavelength. Results of measurement are shown in FIG. 5 and FIG. 6. At a light wavelength of 550 nm, the transmissivity was 48.70%, and the reflectivity was 39.76%.

Example 12

An Mg—Ca layer and a capping layer were formed by the same method as Example 11 except that LiF was vacuum deposited on the Mg—Ca layer to a thickness of 800 Å to form the capping layer, and then transmissivity and reflectivity were measured while varying a light wavelength. Results of measurement are shown in FIG. 5 and FIG. 6. At a light wavelength of 550 nm, the transmissivity was 50.48%, and the reflectivity was 42.93%.

Example 13

An Mg—Ca layer and a capping layer were formed by the same method as Example 11 except that LiF was vacuum deposited on the Mg—Ca layer to a thickness of 900 Å to form the capping layer, and then transmissivity and reflectivity were measured while varying a light wavelength. Results of measurement are shown in FIG. 5 and FIG. 6. At a light wavelength of 550 nm, the transmissivity was 49.27%, and the reflectivity was 43.50%.

Example 14

An Mg—Ca layer and a capping layer were formed by the same method as Example 11 except that NPB was vacuum deposited on the Mg—Ca layer to a thickness of about 600 Å to form the capping layer. Then transmissivity and reflectivity were measured while varying a light wavelength. Results of measurement are shown in FIG. 5 and FIG. 6. At a light wavelength of 550 nm, the transmissivity was 67.31%, and the reflectivity was 37.63%.

Transmissivity and reflectivity of the Mg—Ca layer at 550 nm and the double layer of the Mg—Ca layer/capping layer of Examples 10, Example 11, Example 12, Example 13, and Example 14 are shown in Table 5, and variations of the transmissivity and reflectivity according to a wavelength are shown in FIG. 5 and FIG. 6.

TABLE 5

| | Conditions | | | Reflectivity |
|---|---|---|---|---|
| | Cathode | Capping layer | Transmissivity (%, @550 nm) | (%, @550 nm) |
| Example 10 | Mg:Ca (1:1), 200 Å | — | 16.82 | 31.17 |
| Example 11 | Mg:Ca (1:1), 200 Å | LiF, 700 Å | 48.70 | 39.76 |
| Example 12 | Mg:Ca (1:1), 200 Å | LiF, 800 Å | 50.48 | 42.93 |
| Example 13 | Mg:Ca (1:1), 200 Å | LiF, 900 Å | 49.27 | 43.50 |
| Example 14 | Mg:Ca (1:1), 200 Å | NPB, 600 Å | 68.31 | 37.63 |

Referring to Table 5, FIG. 5, and FIG. 6, the transmissivity of the double layer of the Mg—Cr/the capping layer according to Example 11, Example 12, Example 13, and Example 14 increase when compared to the Mg—Ca layer of Example 10. It is presumed that total reflection of light at a layer interface decreases when the light is transmitted through the double layer of the Mg—Ca layer/the capping layer when compared to when the light is transmitted through only the Mg—Ca layer.

Further, when the capping layer is the LiF layer (Example 11, Example 12, and Example 13), variations of the transmissivity based on an increase in thickness of the capping layer are not large. In addition, the transmissivity is larger when the capping layer is the NPB layer as an organic layer (Example 14) in comparison with when the capping layer is the LiF layer (Example 11, Example 12, and Example 13).

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
   an anode;
   a magnesium-calcium layer; and
   an organic layer interposed between the anode and the magnesium-calcium layer,
   wherein the organic layer comprises at least an organic emission layer, and
   wherein the magnesium-calcium layer comprises magnesium and calcium in an atomic ratio of about 1:1.

2. The organic light emitting device of claim 1, further comprising:
   a capping layer in contact with a surface of the magnesium-calcium layer opposite a surface of the magnesium-calcium layer that is in contact with the organic layer.

3. The organic light emitting device of claim 2,
   wherein the capping layer is selected from the group consisting of an organic layer, an inorganic layer, and a multilayer of the organic layer and the inorganic layer.

4. The organic light emitting device of claim 3,
   wherein the inorganic layer is selected from the group consisting of a silicon oxide ($SiO_2$) layer, a silicon nitride ($SiN_x$) layer, and a silicon oxynitride ($SiO_xN_y$) layer.

5. The organic light emitting device of claim 3,
   wherein the inorganic layer is selected from the group consisting of an indium tin oxide (ITO) layer, an indium zinc oxide (IZO) layer, a tin oxide (TN) layer, and a zinc oxide (ZnO) layer.

6. The organic light emitting device of claim 3,
   wherein the inorganic layer is a lithium fluoride (LiF) layer.

7. The organic light emitting device of claim 3,
   wherein the organic layer of the capping layer comprises at least one selected from the group consisting of NPB, TNATA, TCTA, TDAPB, TDATA, Alq3, Balq and CBP.

8. The organic light emitting device of claim 1,
   wherein the organic layer further comprises an electron transport layer interposed between the magnesium-calcium layer and the organic emission layer, and
   wherein the electron transport layer contacts the magnesium-calcium layer.

9. The organic light emitting device of claim 1,
   wherein the organic layer further comprises at least one of a hole injection layer and a hole transport layer interposed between the anode and the organic emission layer.

10. An organic light emitting device, comprising:
    an anode;
    a magnesium-calcium layer being about 400 Å or less thick; and
    an organic layer interposed between the anode and the magnesium-calcium layer,
    wherein the organic layer comprises at least an organic emission layer, and wherein the magnesium-calcium layer comprises magnesium and calcium in an atomic ratio of about 1:1.

11. The organic light emitting device of claim 10, wherein the magnesium-calcium layer is about 100 Å or more thick.

12. The organic light emitting device of claim 11, wherein the magnesium-calcium layer is about 200 Å to about 300 Å thick.

13. The organic light emitting device of claim 10, further comprising:
a capping layer that is in contact with a surface of the magnesium-calcium layer opposite a surface of the magnesium-calcium layer in contact with the organic layer.

14. The organic light emitting device of claim 13, wherein the capping layer is a transparent capping layer.

15. The organic light emitting device of claim 13, wherein the capping layer has a refractive index that is larger than that of the magnesium-calcium layer.

16. The organic light emitting device of claim 15, wherein the capping layer has a refractive index of about 1.3 to about 2.3.

17. The organic light emitting device of claim 13, wherein the capping layer is selected from the group consisting of an organic layer, an inorganic layer, and a multilayer of the organic layer and the inorganic layer.

* * * * *